(12) United States Patent
Sato

(10) Patent No.: US 11,735,250 B2
(45) Date of Patent: Aug. 22, 2023

(54) SENSE AMPLIFIER ACTIVATION TIMING SCHEME TO SUPPRESS DISTURBANCE IN MEMORY CELLS OF DRAM MEMORY DEVICE

(71) Applicant: Winbond Electronics Corp., Taichung (TW)

(72) Inventor: Takahiko Sato, Yokohama (JP)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 17/395,964

(22) Filed: Aug. 6, 2021

(65) Prior Publication Data

US 2022/0246198 A1 Aug. 4, 2022

(30) Foreign Application Priority Data

Feb. 4, 2021 (JP) ................. 2021-016276

(51) Int. Cl.
*G11C 7/08* (2006.01)
*G11C 11/4091* (2006.01)
(Continued)

(52) U.S. Cl.
CPC ............ *G11C 11/4091* (2013.01); *G11C 8/08* (2013.01); *G11C 11/4076* (2013.01); *G11C 11/4085* (2013.01)

(58) Field of Classification Search
CPC ............ G11C 11/4091; G11C 11/4085; G11C 11/4076
See application file for complete search history.

(56) References Cited

U.S. PATENT DOCUMENTS 6,434,736 B1 * 8/2002 Schaecher ................ G11C 8/18
716/111
2003/0198112 A1 * 10/2003 Eleyan ................... G11C 7/065
365/205
(Continued)

FOREIGN PATENT DOCUMENTS

CN     108369820 A    8/2018
JP     2001-135085 A   5/2001
(Continued)

OTHER PUBLICATIONS

English Translation of JP 2001135085 A, Kasai Masanori, May 18, 2001 (Year: 2001).*
(Continued)

*Primary Examiner* — Mushfique Siddique
(74) *Attorney, Agent, or Firm* — Birch, Stewart, Kolasch & Birch, LLP

(57) ABSTRACT

A semiconductor memory device is provided to suppress occurrence of disturbance regardless of the position of the activated word line. The semiconductor memory device includes a plurality of word lines, a bit line, a plurality of memory cells connected to the bit line and one of the plurality of word lines, a sense amplifier connected to the bit line, and a control portion. The control portion is configured to control timing of activating the sense amplifier. When a position of an activated word line among the plurality of word lines is closer to the sense amplifier, the control portion controls the timing of activating the sense amplifier to be delayed more.

10 Claims, 8 Drawing Sheets

(51) Int. Cl.
   *G11C 11/408*   (2006.01)
   *G11C 11/4076*   (2006.01)
   *G11C 8/08*   (2006.01)

(56) References Cited

U.S. PATENT DOCUMENTS

| | | | |
|---|---|---|---|
| 2008/0074938 A1* | 3/2008 | Inaba | G11C 29/50 |
| | | | 365/201 |
| 2010/0265778 A1* | 10/2010 | Yasuda | G11C 8/18 |
| | | | 365/207 |
| 2018/0190340 A1 | 7/2018 | Kim et al. | |
| 2019/0392876 A1 | 12/2019 | Katoch et al. | |

FOREIGN PATENT DOCUMENTS

| | | | |
|---|---|---|---|
| JP | 2001135085 A * | 5/2001 | |
| TW | 201933350 A | 8/2019 | |

OTHER PUBLICATIONS

Korean Office Action dated Nov. 26, 2022 in Application No. 10-2021-0089338.

* cited by examiner

SENSE AMPLIFIER ACTIVATION TIMING SCHEME TO SUPPRESS DISTURBANCE IN MEMORY CELLS OF DRAM MEMORY DEVICE

CROSS REFERENCE TO RELATED APPLICATIONS

This application claims priority of Japan Patent Application No. JP2021-16276, filed on Feb. 4, 2021, the entirety of which is incorporated by reference herein.

BACKGROUND OF THE INVENTION

Field of the Invention

The present invention relates to a semiconductor memory device.

Description of the Related Art

Semiconductor memory devices, such as dynamic random access memory (DRAM), are known to include a memory cell array composed of a plurality of memory cells arranged in a matrix (for example, Patent Document 1).

As shown in FIG. 1(a), a memory cell array of a semiconductor memory device comprises a sense amplifier array and a word-line driver array. The sense amplifier array comprises a plurality of sense amplifiers arranged at regular intervals in the X direction. The word-line driver array comprises a plurality of word-line drivers arranged at regular intervals in the Y direction.

The word-line drivers drive the word lines electrically connected to the word-line drivers (in the example in FIG. 1, wl(n), wl(n+1), wl(n+α), wherein n and a are arbitrary integers), respectively, and controlled by signals output from a row decode. Moreover, the word lines connected to the respective word-line drivers are arranged at regular intervals in the Y direction and extend in the X direction.

The sense amplifiers drive the bit lines electrically connected to the sense amplifiers (in the example in FIG. 1, bl(k), bl(k+β), where n and β are arbitrary integers), respectively, and controlled by signals output from a column decoder. Moreover, the bit lines connected to the respective sense amplifiers are arranged at regular intervals in the X direction and extend in the Y direction.

The memory cells MC are arranged at the intersection of respective word lines and the respective bit lines. Each memory cell MC comprises an N-channel-type metal oxide semiconductor field effect transistor (MOSFET) and a capacitor connected to the MOSFET. The gate of the MOSFET is electrically connected to the corresponding word line, and the drain of the MOSFET is electrically connected to the corresponding bit line. Moreover, one terminal of the capacitor is connected to the source of the MOSFET, and the other terminal of the capacitor is connected to the plate line PL. A specific plate potential is applied to the plate line PL.

FIG. 1 (b) is a schematic diagram showing timing of activating word lines and bit lines when memory cells in a memory cell array is accessed in a memory cell array in a conventional semiconductor memory device. Here, the case of accessing a memory cell MC in the region R close to the word-line driver array and close to the sense amplifier array is represented as Case 1, and the case of accessing a memory cell MC in the region r far away from the word-line driver array and close to the sense amplifier array line is represented as Case 2.

First, Case 1 will be explained. At time t1, when the word-line activation signal wlon used to activate the word line (that is, wl(n)) is valid (at a high level), the word-line driver connected to the word line wl(n) starts driving (activating) the word line wl(n). Herein, the voltage of the word line wl(n) is expressed as wl(n)[R]. During the period from the beginning of the activation of the word line wl(n) to the completion thereof, the voltage of the word line wl(n+1) is increased due to the occurrence of the crosstalk between the word line wl(n) and its adjacent word line (wl(n+1)). Herein, the voltage of the word line wl(n+1) is expressed as wl(n+1)[R]. Then, when the activation of the word line wl(n) is completed, the voltage of the word line wl(n+1) is gradually decreased and then becomes being at a low level at time t2.

After that, at time t3, when the sense-amplifier activation signal saon for activating a bit line (that is, bl(k)) is input to the memory cell array, the sense amplifier connected to the bit line bl(k) starts driving (activating) the bit line bl(k). Then, at time t4, the activation of the bit line bl(k) is completed.

PRIOR ARTS

Patent Documents

[Patent Document 1] JP No. 2011-146116

BRIEF SUMMARY OF THE INVENTION

The Problems Solved by the Invention

On the other hand, in Case 2, since the region r is separated from the word-line driver array, at time t1, the period from the time when the word-line activation signal wlon is valid to the time when the activation of the word line wl(n) is completed is longer than Case 1. Herein, the voltage of the word line wl(n) is expressed as wl(n)[r]. Moreover, the word line wl(n+1) which has been increased due to the occurrence of the crosstalk is gradually decreased as in Case 1, and, at time t5 following time t4, the voltage of the word line wl(n+1) becomes being at a low level. Herein, the voltage of the word line wl(n+1) is expressed as wl(n+1)[r].

However, in this case, as shown by the dotted lines in FIG. 1(b), even after the activation of the bit line bl(k+β) in the region r is completed at time t4, an abnormality (disturbance) may occur because the voltage of the word line wl(n+1) [r] becomes higher than the low level. The above abnormality indicates that the amount of the charges of the capacitor in the memory cell MC connected to the word line wl(n+1) and the bit line bl(k+β) is decreased. Therefore, when the position of the activated word line (i.e., the position of the memory cell being accessed) is farther from the word-line driver array and the closer to the sense amplifier, the possibility of the occurrence of disturbance is greater.

In view of the foregoing problems, the present invention aims to provide a semiconductor memory device that can suppress the occurrence of disturbance regardless of the position of the activated word line.

Means for Solving Problems

In order to solve the above-mentioned problems, the present invention provides a semiconductor memory device which comprises a plurality of word lines, a bit line, a plurality of memory cells connected to the bit line and one of the plurality of word lines, a sense amplifier connected to the bit line, and a control portion. The control portion is configured to control timing of activating the sense amplifier. When a position of an activated word line among the plurality of word lines is closer to the sense amplifier, the control portion controls the timing of activating the sense amplifier to be delayed more.

When the position of the activated word line is close to the sense amplifier, the timing of activating sense amplifier is delayed. For example, even in the cases where a word line close to the sense amplifier is activated, the sense amplifier can be activated after the voltage of the word line adjacent to the activated word line drops to a low level. Therefore, the charges of the memory cell MC connected to the adjacent word line can be prevented from being decreased. Accordingly, regardless of the position of the activated word line, the occurrence of interference can be suppressed.

The control portion controls the timing of activating the sense amplifier according to a signal representing the activated word line among the plurality of the word lines.

It is easy to determine whether the activated word line is close to the sense amplifier according to the signal representing the activated word line, so the timing of activating the sense amplifier can be easily controlled.

The control portion comprises a circuit portion. When a signal for activating one of the plurality of word lines is input, the control portion delays the signal for activating the sense amplifier, such that when the position of the one word line is closer to the sense amplifier, the timing of activating the sense amplifier is delayed more.

When the activated word line is close to the sense amplifier, since the output of the signal for activating the sense amplifier is delayed, the timing of activating the sense amplifier can be delayed.

When the plurality of word lines are classified into a plurality of groups according to the distance between the plurality of word lines and the sense amplifier, the control portion controls the timing of activating the sense amplifier based delay amount set for the group which the activated word line among the plurality of word lines is classified into, such that the set delay amount is greater as the distance between the group and the sense amplifier is shorter.

The timing of activating the sense amplifier can be controlled through setting delay amount for each of the plurality of groups. For example, compared with the cases where respective delay amount is set for each of the plurality of word lines, the circuit and device for storing the delay amount can be simplified, and the process for setting the delay amount can be reduced at the same time. Therefore, the timing of activating the sense amplifier can be easily controlled.

The information used to identify the group which the activated word line among the plurality of word lines is classified into comprises a signal representing the activated word line among the plurality of word lines.

It is easy to determine which group the activated word line is classified into according to the signal representing the activated word line. Therefore, it is easier to control the timing of activating the sense amplifier.

The occurrence of interference can be suppressed regardless of the position of the activated word line.

BRIEF DESCRIPTION OF THE DRAWINGS

FIG. 1 (b) is a schematic diagram showing timing of activating word lines and bit lines when memory cells in a memory cell array is accessed;

DETAILED DESCRIPTION OF THE INVENTION

Figure 2:
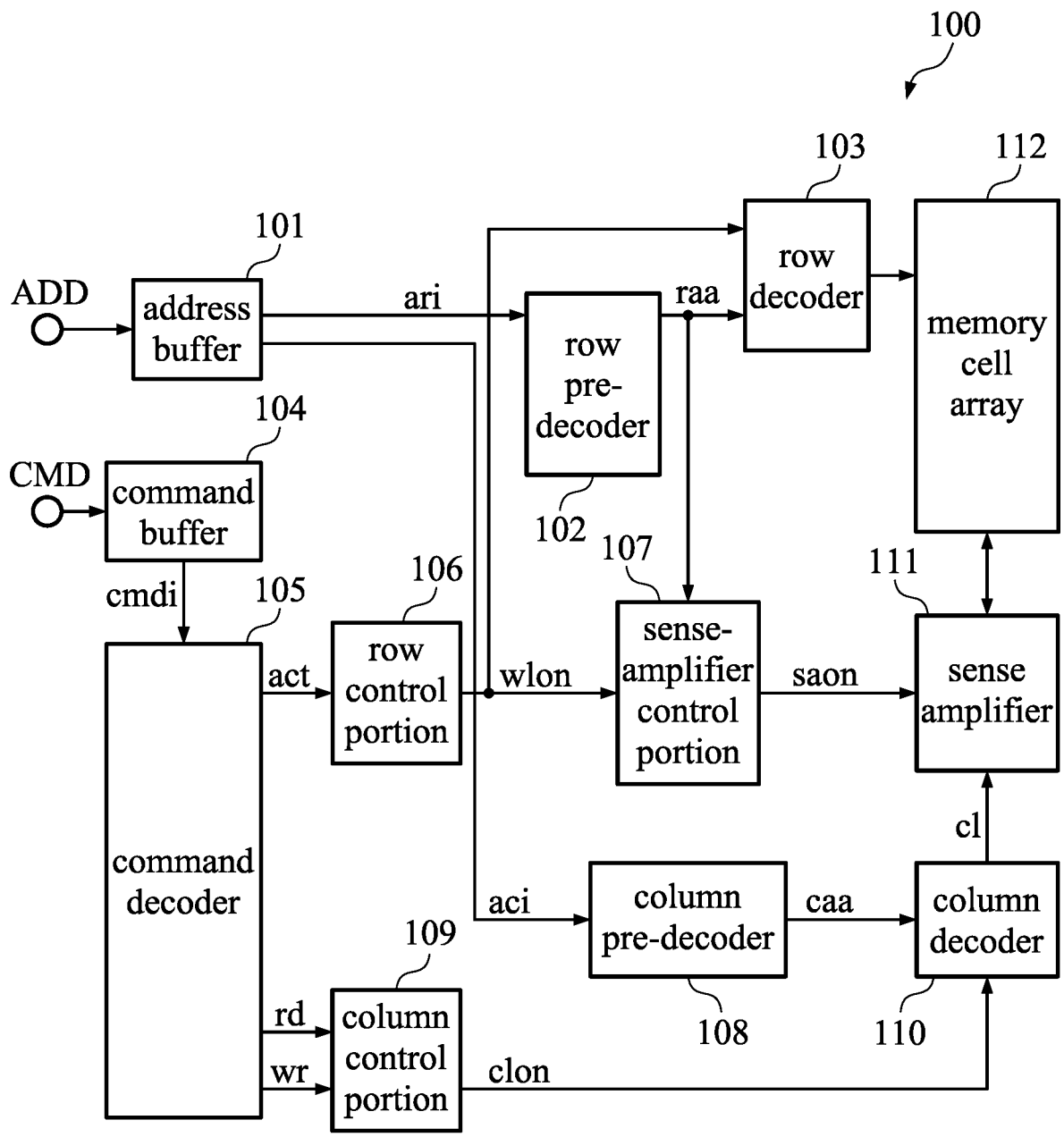
FIG. 2 is a block diagram of a configuration of a semiconductor memory device according to an embodiment of the present invention.

FIG. 2 is a block diagram of a configuration of a semiconductor memory device according to an embodiment of the present invention. A semiconductor memory device 100 according to the embodiment comprises an address buffer 101, a row pre-decoder 102, and a row decoder 103. Moreover, the semiconductor memory device 100 comprises a command buffer 104, a command decoder 105, a row control portion 106, a sense-amplifier control portion 107, and a column pre-decoder 108. The semiconductor memory device 100 also comprises a column control portion 109, a column decoder 110, a sense amplifier 111, and a memory cell array 112.

Each of the portions 101-112 in the semiconductor memory device 100 may be composed of specialized hardware devices or logic circuits. Further, in order to simplify the description, other well-known configurations (such as power supply circuits, data input/output terminals, clock generators, etc.) are not shown.

The address buffer 101 outputs a signal ari, which represents the row address input from an external device (for example, a memory controller, etc.) to an address terminal (ADD), to the column pre-decoder 102. Moreover, the address buffer 101 outputs a signal aci, which represents the column address input from the external device to the address terminal (ADD), to the column pre-decoder 108.

Figure 4:
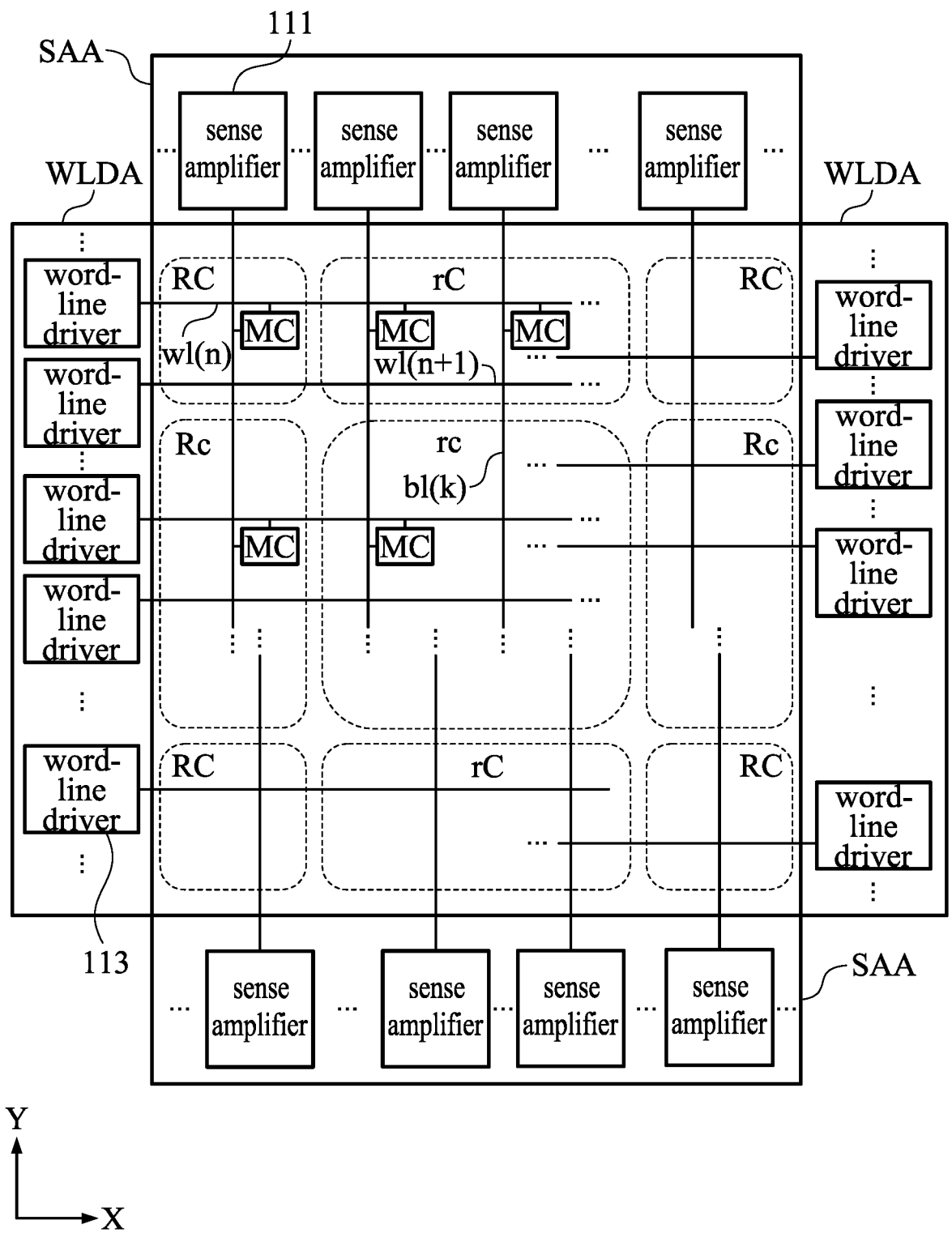
FIG. 4 is an enlarged view of a part of FIG. 3.

The row pre-decoder 102 pre-decodes the signal ari which is input from the address buffer 101 to generate a row address signal raa. The row address signal raa represents the activated word line among a plurality of word lines (as shown in FIG. 4, the word lines wl(n), wl(n+1), ... (n is an arbitrary integer). Then, the row pre-decoder 102 outputs the generated row address signal raa to the row decoder 103 and the sense-amplifier control portion 107.

When a word-line activation signal wlon for activating a word line is in a valid state and is input from the row control portion 106, the row decoder 103 controls a word-line driver 113 among a plurality of word-line drivers in the memory cell array 112, which is coupled to the word line represented by the row address signal raa, to activate the word line.

The command buffer 104 outputs a signal cmdi, which represents a command input from the external device to a command terminal (CMD), to the command decoder 105.

The command decoder 105 decodes the signal cmdi input from the command buffer 104 and generates internal commands. Herein, the generated internal commands comprise, for example, an active signal act, a read signal rd, and a write signal wr. Moreover, although not shown in the figure, the command decoder 105 can generate a pre-charge signal and an update signal as internal commands. When an active signal act is generated in response to the signal cmdi, the command decoder 105 outputs the active signal act to the row control portion 106; when a read signal rd or a write signal wr is generated in response to the signal cmdi, the command decoder 105 outputs the generated read signal rd or write signal wr to the column control portion 109.

When the active signal act is input from the command decoder 105, the row control portion 106 outputs the valid word-line activation signal wlon to the row decoder 103 and the sense amplifier portion 107.

When the valid word-line activation signal wlon is input from the row control portion 106, the sense-amplifier control portion 107 makes a sense-amplifier activation signal saon valid for activating a sense amplifier and outputs it to the sense amplifier 111.

When the position of the activated word line among the word lines wl(n), wl(n+1), . . . is closer to the sense amplifiers 111, the sense-amplifier control portion 107 controls to the timing of activating the sense amplifiers 111 to be delayed more.

Moreover, according to the row address signal raa input from the row pre-decoder 102 (the row address signal raa represents the activated word line among the word lines wl(n), wl(n+1) . . . ), the sense-amplifier control portion 107 controls the timing of activating the sense amplifiers 111. Therefore, it is easy to determine whether the activated word line is close to the sense amplifiers 111 according to the row address signal raa. Accordingly, the timing of activating the sense amplifiers can be easily controlled.

Further, the sense amplifier control portion 107 is an example of the "control portion" in the present invention. The function of the sense amplifier control portion 107 will be described in detail in the following paragraphs.

The column pre-decoder 108 pre-decodes the signal aci input from the address buffer 101 to generate a column address signal caa which represents the activated bit line. Then, the column pre-decoder 108 outputs the generated row address signal caa to the row decoder 110.

When the read signal rd or the write signal wr is input from the command decoder 105, the column control portion 109 makes a signal don for activating a bit line valid and outputs it to the column decoder 110.

When the signal don with the valid state is input from the column control portion 109 to the row decoder 110, the column decoder 110 outputs a signal cl for activating the bit line, among the bit lines in the memory cell array 112, represented by the column address signal caa to the sense amplifier 111.

As shown in FIG. 4 described later, a plurality of sense amplifiers 111 are arranged in the memory cell array 112. When the sense-amplifier activation signal saon is input from the sense-amplifier control portion 107, among the sense amplifiers 111, the sense amplifier 111 electrically connected to the bit line represented by the signal cl is activated to drive the bit line electrically connected to the sense amplifier 111 itself. Then, the sense amplifier 111 amplifies the signal (data) on the bit line.

Figure 3:
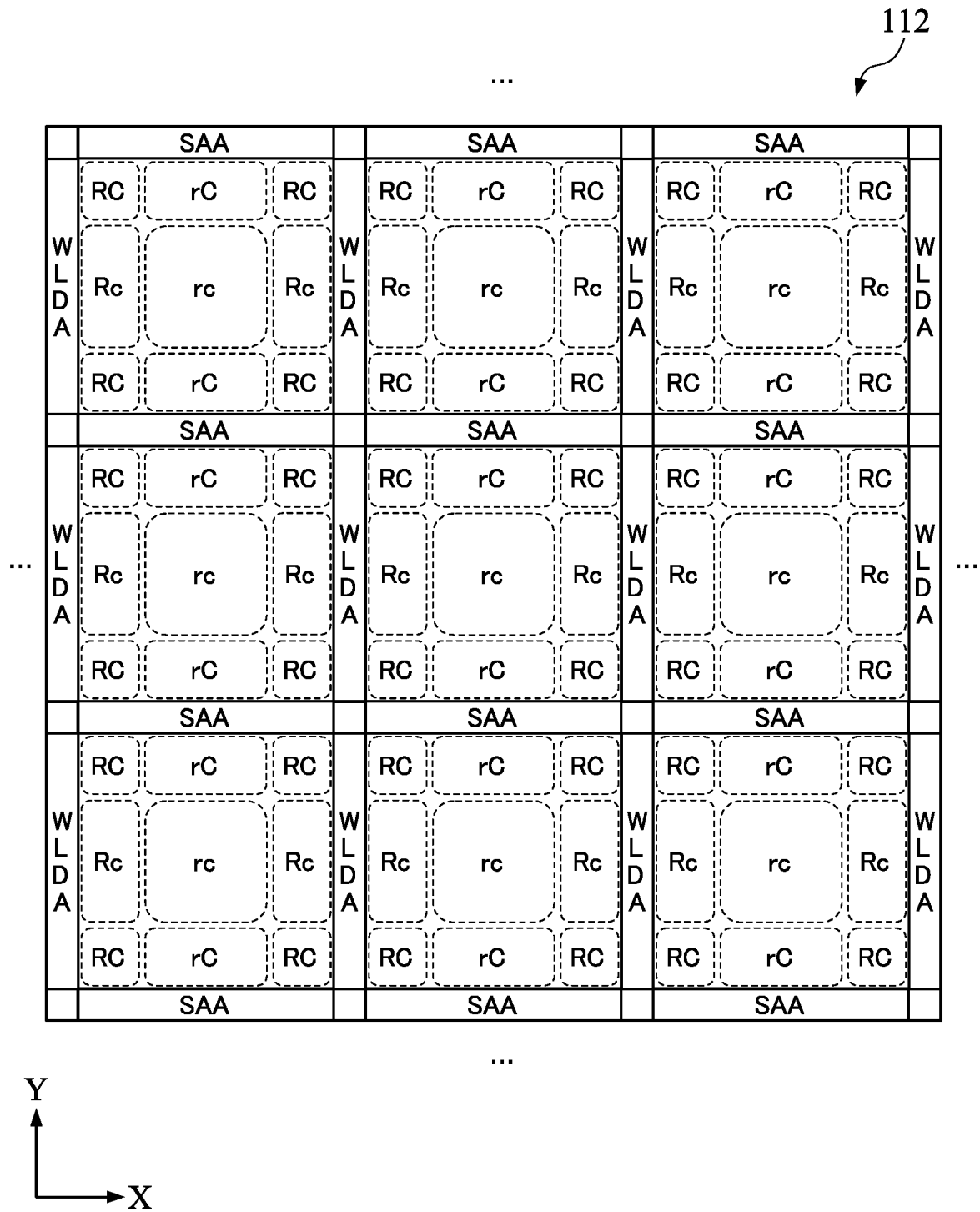
FIG. 3 is a schematic diagram showing a configuration of a memory cell array according to an embodiment of the present invention.

As shown in FIG. 3, the memory cell array 112 comprises a plurality of sense amplifier arrays SAA extending in the X direction and arranged at regular intervals in the Y direction and further comprises a plurality of word-line driver array WLDA extending in the Y direction and at regular intervals in the X direction. As shown in FIG. 4, in each sense amplifier array SAA, a plurality of sense amplifiers 111 are arranged at regular intervals in the X direction; in each word line driver array WLDA, a plurality of word-line drivers 113 are arranged at regular intervals in the Y direction.

The plurality of word-line drivers 113 are configured to drive the word lines wl(n), wl(n+1) electrically connected to the word-line drivers 113. When a signal for activating a word line is input from the row decoder 103, the word-line drivers 113 drive the corresponding word lines.

As shown in FIG. 4, in the region (memory mat) surrounded by the adjacent sense amplifier arrays SAA in the Y direction and the adjacent word-line driver arrays WLDA in the X direction, a plurality of word lines wl (n), wl(n+1), . . . , a plurality of bit lines bl(k), . . . (k is an arbitrary integer), and memory cells MC electrically connected to any of the word lines wl(n), wl(n+1), . . . and one of the bit lines bl(k). Furthermore, in order to avoid making the figure complicated, FIG. 4 shows only a part of the memory cells MC.

The plurality of word lines wl(n), wl(n+1), . . . are arranged at regular intervals in the Y direction and extend in the X direction. The plurality of word lines wl(n), wl(n+1), . . . are electrically connected to the corresponding word line drivers 113 at one end of the extending direction (the left or right end in FIG. 4). Moreover, the plurality of bit lines bl(k), . . . are arranged at regular intervals in the X direction and extend in the Y direction. The plurality of bit lines bl(k), . . . are arranged to be perpendicular to the word lines wl(n), wl(n+1), . . . . Moreover, the plurality of bit lines bl(k), . . . are electrically connected to the corresponding sense amplifiers 111 at one end of the extending direction (the upper or lower end in FIG. 4). Further, for example, the word lines which are connected to the word line drivers 113 of the word-line driver array WLDA at one end of the X direction (the left side in FIG. 4) and the word lines which are connected to the word line drivers 113 of the word-line driver array WLDA at the other end of the X direction (the right side in FIG. 4) can be alternately arranged in the Y direction on the memory mat. Moreover, for example, the bit lines which are connected to the sense amplifiers 111 of the sense amplifier array SAA at one end of the Y direction (the upper side in FIG. 4) and the bit lines which are connected to the sense amplifiers 111 of the sense amplifier array SAA at the other end of the Y direction (the lower side in FIG. 4) can be alternately arranged in the X direction on the memory mat.

Figure 1A:
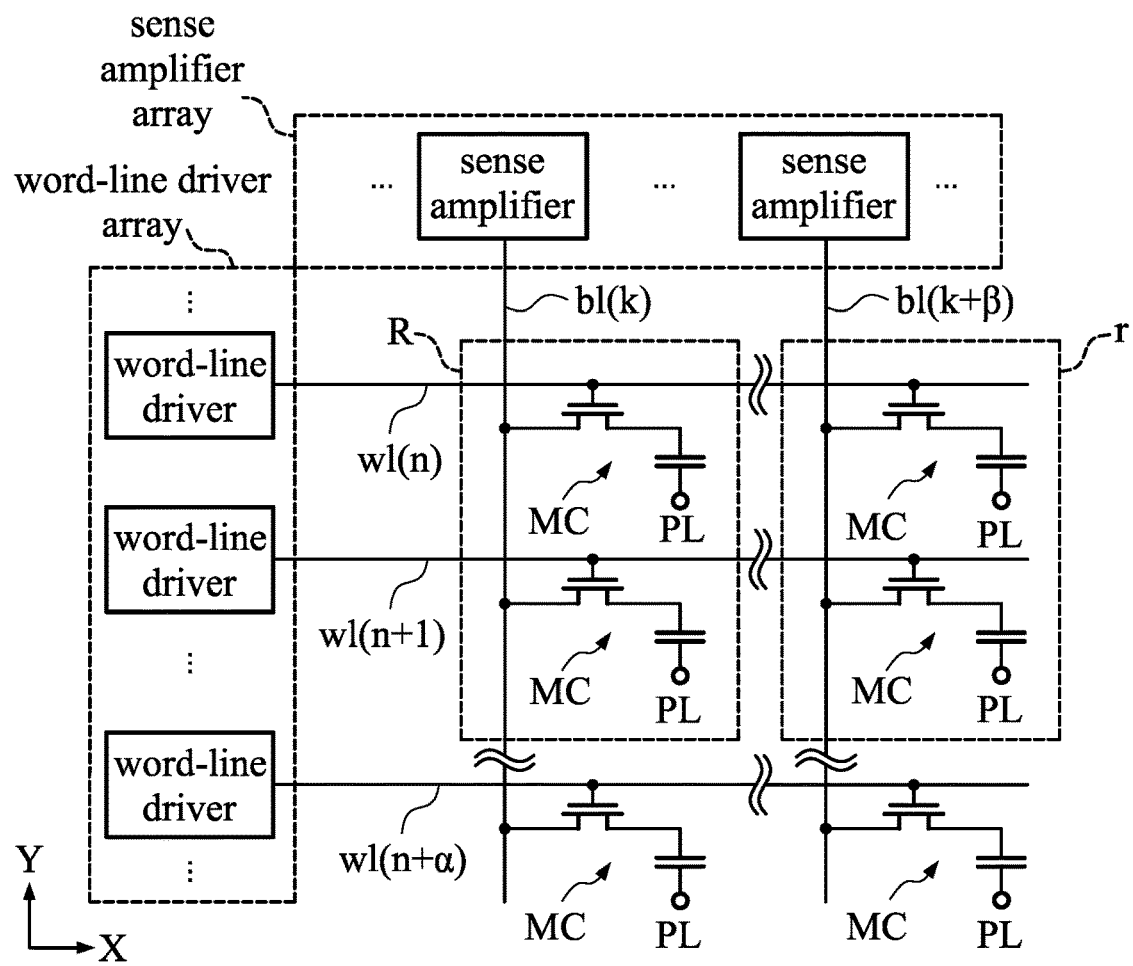
FIG. 1 (a) is a schematic diagram showing a memory cell array configuration in a conventional semiconductor memory device.
Figure 1B:
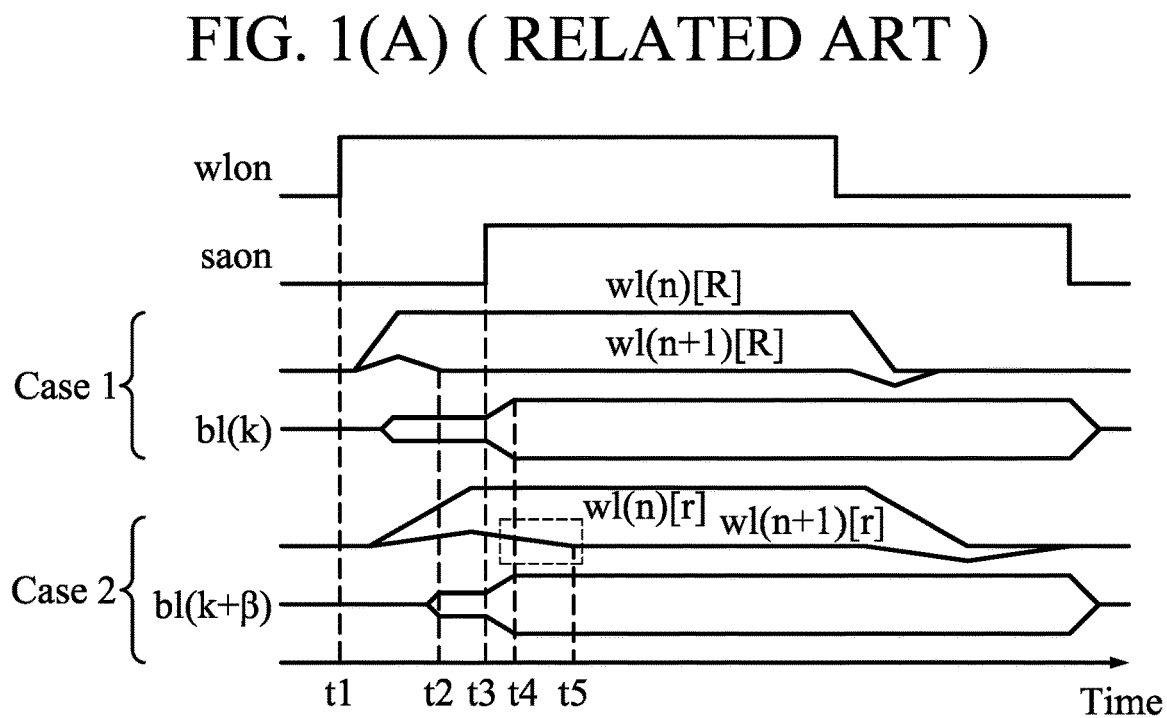

Each of the plurality of memory cells MC is arranged at the intersection of any one of the plurality of word lines wl(n), wl(n+1), . . . and any one of the plurality of bit lines bl(k), . . . . Moreover, the arrangement of each memory cell MC may be the same as a well-known arrangement (for example, the arrangement shown in FIG. 1(a)).

Further, since the details of the data control of the individual memory cells MC are the same as the well-known technology, the related description will be omitted in the embodiment.

The region (memory mat) surrounded by the sense amplifier arrays SAA and the word-line driver arrays WLDA is divided into a plurality of regions with different types (RC, Rc, rC, rc in the embodiment). In the following, the regions with different types are described. RC represents the region that is close to the word-line drivers 113 and also close to the sense amplifiers 111. Rc represents the region that is close to the word-line drivers 113 but far away from the sense amplifiers 111. Moreover, rC represents the region that is far away from the word-line drivers 113 but close to the sense amplifiers 111. rc represents the region that is far away from the word-line drivers 113 and also far away from the sense amplifiers 111. In this case, as shown in FIG. 4, the plurality of word lines wl(n), wl(n+1), . . . are classified into the first group close to the sense amplifiers 111 (the group of word lines arranged in the RC regions or the rC regions) and the second group away from the sense amplifiers 111 (the group of word lines arranged in the Rc regions or the rc regions).

Next, the function of the sense-amplifier control portion 107 in the embodiment will be described in detail. When the plurality of word lines wl(n), wl(n+1), . . . are classified into a plurality of groups according to the distances between the word lines and the sense amplifiers 111, there is a delay time (delay amount) td_saon for activating sense amplifiers 111. The above-mentioned delay time td_saon is set for the group which the activated word line among the plurality of word lines wl(n), wl(n+1) is classified to. The sense-amplifier control portion 107 can control the timing of activating sense amplifiers 111 based on the above-set delay time td_saon, so that the delay time td_saon is longer (larger) when the distance between the group and the sense amplifiers 111 is shorter. Therefore, the timing of activating sense amplifiers 111 can be controlled according to the respective delay time td_saon set for each of the groups. Compared with the cases where respective delay time td_saon is set for each of a plurality of word lines wl(n), wl(n+1), . . . , the circuit and device for storing the delay time td_saon can be simplified, and the process for setting the delay time td_saon can be reduced at the same time. Therefore, the timing of activating sense amplifiers 111 can be easily controlled.

Moreover, the information used to identify the group which the activated word line among the plurality of word lines wl(n), wl(n+1), . . . is classified into comprises the row address signal raa (representing the activated word line among the plurality of word lines wl(n), wl(n+1), . . . ). Therefore, it is easy to identify which group the activated word line is classified into according to the row address signal raa. Then, it is easier to control the timing of activating sense amplifiers 111.

Figure 5:
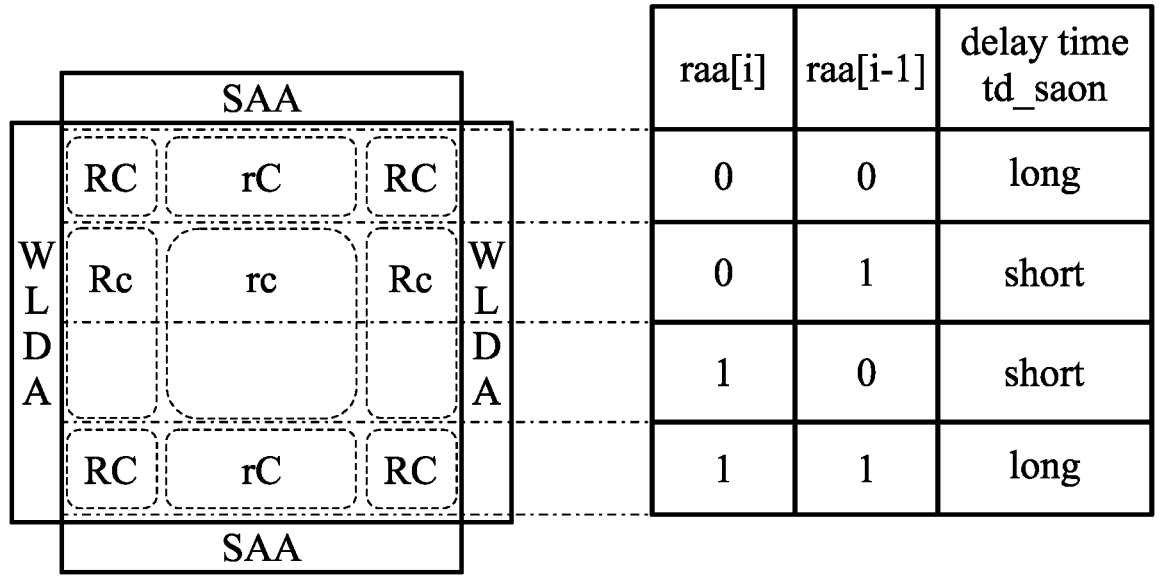
FIG. 5 is a schematic diagram showing relationship between a plurality of regions in the memory mat and delay time of activation of sense amplifiers.
Figure 5:
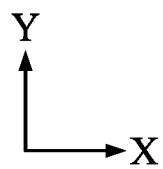

FIG. 5 is a schematic diagram the relationship between a plurality of regions (RC regions, rC regions, Rc regions, and rc regions) in the memory mat and the delay time td_saon for activating sense amplifiers 111. The row address signal raa generated by the row pre-decoder 102 comprises information raa[i], raa[i−1] with one or more bits (herein, 2 bits) (i is an arbitrary integer). The above one or more bits indicate which group (first group or second group) the activated word line is classified into. In FIG. 5, when the word lines arranged in the upper RC regions and the upper rC region in the memory mat are activated, the row address signal raa comprises raa[i]=0 and raa[i−1]=0; when the word lines arranged in the upper portions in the Rc regions and the upper portion of the rc region in the memory mat are activated, the row address signal raa comprises raa[i]=0 and raa[i−1]=1; the word lines arranged in the lower portions in the Rc regions and the power portions of the rc region in the memory mat are activated, the row address signal raa comprises raa[i]=1 and raa[i−1]=0; and when the word lines arranged in the lower RC regions and the rC region in the memory mat are activated, the column address signal raa comprises raa[i]=1 and raa[i−1]=1.

According to the above paragraph, in the embodiment of FIG. 5, when the values of raa[i] and raa[i−1] are the same, the activated word lines are classified into the first group (the group closer to the sense amplifiers 111). In addition, when the values of raa[i] and raa[i−1] are different, the activated word lines are classified into the second group (the group far from the sense amplifiers 111).

Moreover, as shown in FIG. 5, when the values of raa[i] and raa[i−1] are the same (that is, when the word line close to the sense amplifiers 111 is activated), the delay time td_saon for activating sense amplifiers 111 is set to be longer; when the values of raa[i] and raa[i−1] are different (when the word line away from the sense amplifiers 111 is activated), the delay time td_saon for activating sense amplifier 111 is set to be short.

The sense-amplifier control portion 107, for example, can adjust the effective output timing of the sense-amplifier activation signal saon by using a look-up table of the relationship between raa[i] and raa[i−1] and the delay time td_saon as shown in FIG. 5. In this way, there is a delay time td_saon (delay amount) for activating sense amplifiers 111. The above-mentioned delay time td_saon is set for the group which the activated word line among the plurality of word lines wl(n), wl(n+1), . . . is classified to. The sense-amplifier control portion 107 can control the timing of activating sense amplifiers 111 based on the above-set delay time td_saon, so that the delay time td_saon is longer (larger) when the distance between the group and the sense amplifiers 111 is shorter. Moreover, in this way, according to the row address signal raa (representing the activated word line among the plurality of word lines wl(n), wl(n+1), . . . ), the sense-amplifier control portion 107 can control the timing of activating sense amplifiers 111.

Moreover, the sense-amplifier control portion 107 comprises a circuit portion 200, which delays the output of the signal for activating sense amplifiers 111 when the word-line activation signal wlon (used to activate any one of the plurality of word lines wl(n), wl(n+1) is input, so that the timing of activating sense amplifiers 111 is delayed more when the position of any word line is closer to the sense amplifiers 111. Therefore, when the activated word line is close to the sense amplifiers 111, the output of the sense-amplifier activation signal saon (used to activate the sense amplifiers 111) is delayed. Accordingly, the timing of activating sense amplifiers 111 can be delayed.

Figure 6:
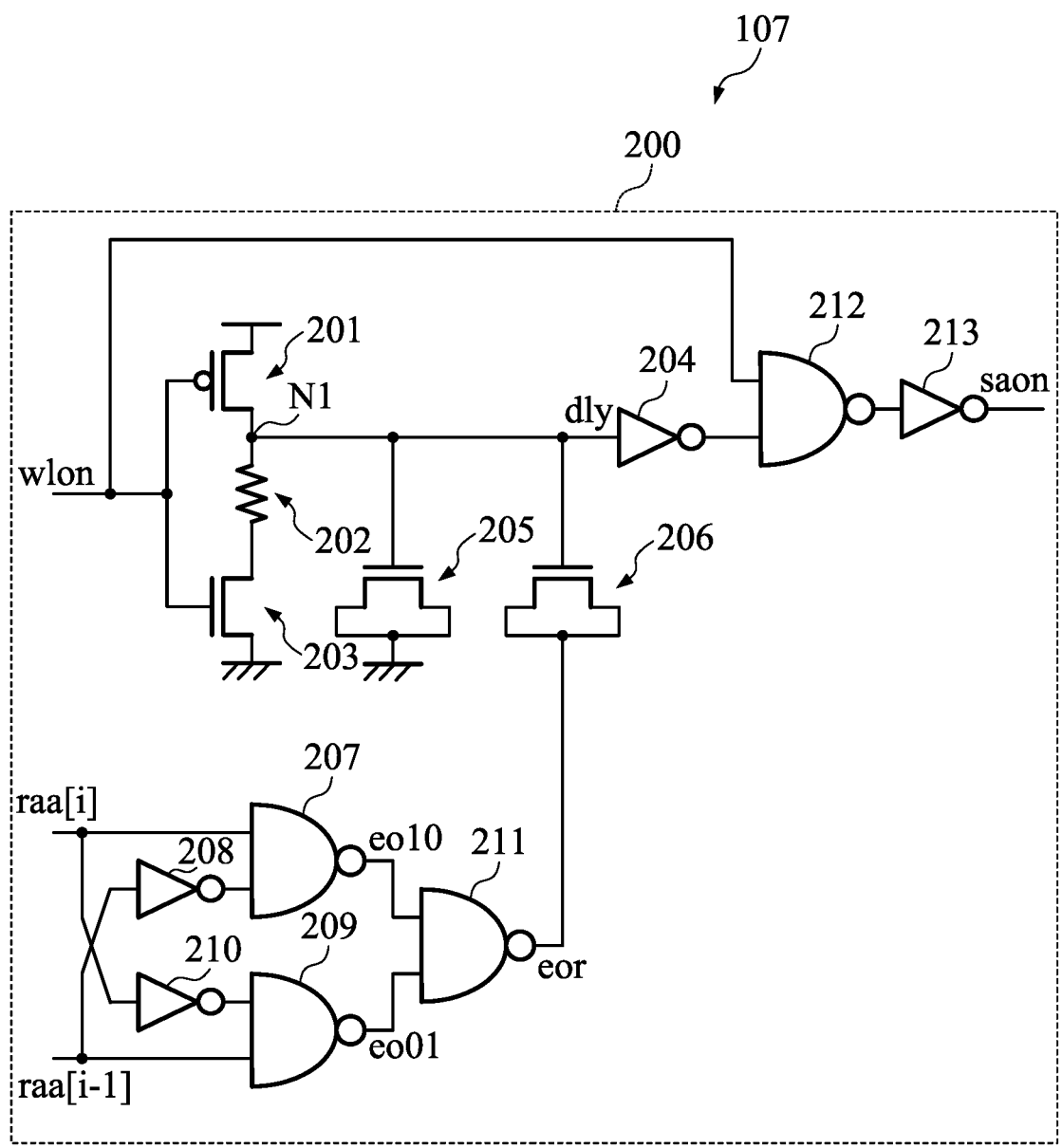
FIG. 6 is a schematic diagram showing a configuration of a circuit.

Referring to FIG. 6, the configuration of the circuit portion 200 will be described. The circuit portion 200 comprises a P-channel-type MOSFET 201, a resistor 202, an N-channel-type MOSFET 203, an inverter 204, MOS capacitors 205 and 206, a NAND circuit 207, an inverter 208, a NAND circuit 209, an inverter 210, and a NAND circuit 211 and 212, and an inverter 213.

The MOSFET 201, the resistor 202, and the MOSFET 203 are connected in series between the power supply and the ground. Moreover, the word-line activation signal wlon is input to the gates of the MOSFET 201 and MOSFET 203. The connection node N1 between the MOSFET 201 and the resistor 202 is connected to the input terminal of the inverter 204. Moreover, the gate of the MOS capacitor 205 composed of an N-channel type MOSFET is connected to the connection node N1. Moreover, the drain and source of the MOS capacitor 205 are connected to the ground.

Moreover, the gate of the MOS capacitor 206 composed of an N-channel-type MOSFET is connected to the connection node N1. The drain and source of the MOS capacitor 206 are connected to the output terminal of the NAND circuit 211.

The information raa[i] included in the row address signal raa is input to one input terminal of the NAND circuit 207. Moreover, the information raa[i−1] included in the row address signal raa is input to the input terminal of the inverter 208, and the output terminal of the inverter 208 is connected to the other input terminal of the NAND circuit 207.

One input terminal of the NAND circuit 209 is connected to the output terminal of the inverter 210. Moreover, the information raa[i−1] included in the row address signal raa is input to the other input terminal of the NAND circuit 209. The information raa[i] included in the row address signal raa is input to the input terminal of the inverter 210.

One input terminal of the NAND circuit 211 is connected to the output terminal of the NAND circuit 207, and the other input terminal of the NAND circuit 211 is connected to the output terminal of the NAND circuit 209.

The word-line activation signal wlon is input to one input terminal of the NAND circuit 212. Moreover, the other input terminal of the NAND circuit 212 is connected to the output terminal of the inverter 204. The output terminal of the NAND circuit 212 is connected to the input terminal of the inverter 213.

The inverter 213 logically inverts the signal input from the NAND circuit 212 and outputs the logically inverted signal as the sense-amplifier activation signal saon.

In the following, the operation of the circuit portion 200 will be explained. First, when the word-line activation signal wlon is at a low level, the MOSFET 201 is turned on while the MOSFET 203 is turned off. In this situation, the MOS capacitor 205 is charged through the MOSFET 201. Moreover, in this situation, the potential of one terminal of the NAND circuit 212 is at a high level, while the potential of the other input terminal of the NAND circuit 212 is at a low level. Therefore, the output signal of the NAND circuit 212 is at a high level, and the sense-amplifier activation signal saon output from the inverter 213 is at a low level.

Next, when the word-line activation signal wlon becomes being at a high level, the MOSFET 201 is switched to an off state while the MOSFET 203 is switched to an on state. In this situation, the MOS capacitor 205 starts being discharged. Then, as the MOS capacitor 205 is discharged, when the potential of the delay signal dly input to the inverter 204 drops, the potential of the other input terminal of the NAND circuit 212 connected to the output terminal of the inverter 204 becomes being at a high level. Therefore, the output signal of the NAND circuit 212 becomes being at a low level, and the sense-amplifier activation signal saon output from the inverter 213 becomes being at a high level (valid).

Herein, in each of the case where the value of the information is equal to "0" (raa[i]=0) and the value of the information raa[i−1] is equal to "0" (raa[i−1]=0) and the case where the value of the information is equal to "1" (raa[i]=1) and the value of the information raa[i−1] is equal to "1" (raa[i−1]=1), the signal eo10 output from the NAND circuit 207 and the signal eo01 output from the NAND circuit 209 become being at a high level. Therefore, the signal eor output from the NAND circuit 211 becomes being at a low level. In these cases, by charging the MOS capacitor 206, the amount of charges of the delay signal dly becomes greater, and the rate of the dropping of the potential of the delay signal dly becomes slower. Therefore, the timing at which the sense-amplifier activation signal saon output from the inverter 213 reaches a high level is delayed.

On the other hand, in each of case where the value of the information raa[i] is equal to "0" (raa[i]=0) and the value of the information raa[i−1] is equal to "1" (raa[i−1]=1) and the case where the value of the information raa[i] is equal to "1" (raa[i]=1) and the value of the information raa[i−1] is equal to "0" (raa[i−1]=0), the output signal eo10 output from the NAND circuit 207 or the signal eo01 output from the NAND circuit 209 becomes being at a low level. Therefore, the signal eor output from the NAND circuit 211 becomes being at a high level. In these cases, the MOS capacitor 206 is not charged. Thus, the amount of charges of the delay signal dly becomes less, and the potential of the delay signal dly drops rapidly due to the MOSFET 203. Therefore, the timing at which the sense-amplifier activation signal saon output from the inverter 213 reaches the high level is earlier than the timing of the above situation that the MOS capacitor 206 is charged.

Figure 7:
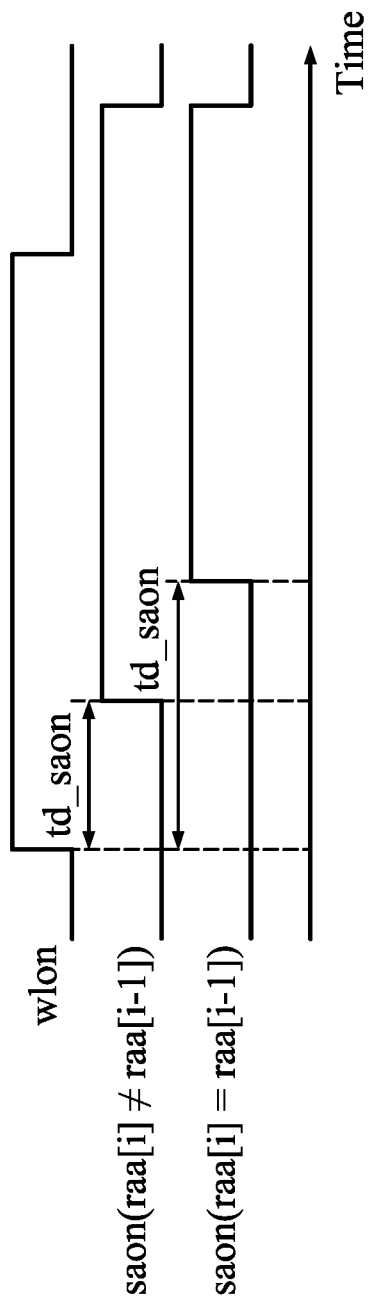
FIG. 7 is a timing diagram of an operation of a circuit.

FIG. 7 is a timing diagram of an operation example of the circuit. As described with reference to FIGS. 5 and 6, in each of the case where the value of the information raa[i] is equal to "0" (raa[i]=0) and the value of the information raa[i−1] is equal to "0" (raa[i−1]=0) and the case where the value of the information raa[i] is equal to "1" (raa[i]=1) and the value of the information raa[i−1] is equal to "1" (raa[i−1]=1), the delay time td_saon from the rising edge of the word-line activation signal wlon to the rising edge of the sense-amplifier activation signal saon is greater than the delay time td_saon in the case where the value of the information raa[i] is equal to "0" and the value of the information raa[i−1] is equal to "1" (raa[i−1]=1) and the delay time td_saon in the case where the value of the information raa[i] is equal to "1" (raa[i]=1) and the value of the information raa[i−1] is equal to "0" (raa[i−1]=0). That is, when the activated word line is classified into the first group (the group close to the sense amplifiers 111), the timing of activating sense amplifiers 111 is delayed. Further, the timing when the sense-amplifier activation signal saon is switched to a low level (invalid) may be later than the timing when which the falling edge of the word-line activation signal wlon occurs. Moreover, the timing when the sense-amplifier activation signal saon is switched to the low level (invalid) can be the same for the cases where the information raa[i] and the information raa[i−1] has the same value and the cases where the information raa[i] and the information raa[i−1] has the difference values. In another embodiment, the timing when the sense-amplifier activation signal saon is switched to the low level (invalid) in the cases where the information raa[i] and the information raa[i−1] has the same value is different from the timing when the sense-amplifier activation signal saon is switched to the low level in the cases where the information raa[i] and the information raa[i−1] has the difference values (for example, the timing when the sense-amplifier activation signal saon is switched to the low level (invalid) in the cases where the information raa[i] and the information raa[i−1] has the same value is different from and later than that in the cases where the information raa[i] and the information raa[i−1] has the difference values).

Figure 8A:
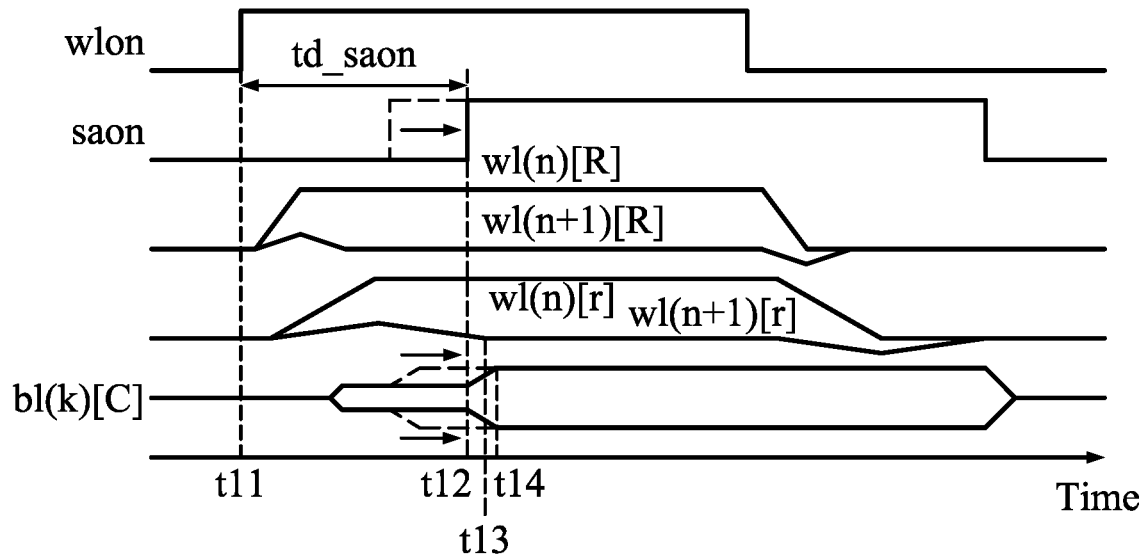
FIGS. 8(a) and 8(b) are schematic diagrams showing activating timing of word lines and a bit line when a memory cell located in the region far from a word-line driver and close to and far from a sense amplifier respectively is accessed in a semiconductor memory device of embodiments of the present invention.

FIGS. 8(a) and (8b) are schematic diagrams showing the timing of the operation of the semiconductor memory device 100 according to the embodiment. First, referring to FIG. 8(a), the timing of activating the word lines wl(n) and wl(n+1) and the bit line bl(k) in the case where a memory cell MC in the region (rC region) far away from the word line drivers 113 and close to the sense amplifiers 111 is accessed will be described.

At time t11, when the word-line activation signal wlon for activating the word line wl(n) becomes being at a high level (valid), the word line driver 113 connected to the word line wl(n) starts driving (activating) the word line wl(n). Herein, the voltage of the word line wl(n) arranged in the RC region is expressed as wl(n)[R]. During the period from the beginning of the activation of the word line wl(n) arranged in the RC region to the completion thereof, the voltage of the word line wl(n+1) arranged in the RC region is increased due to the occurrence of the crosstalk between the word line wl(n) and its adjacent word line (wl(n+1)) in the RC region. Further, herein, the voltage of the word line wl(n+1) arranged in the RC region is expressed as wl(n+1)[R]. Then, when the activation of the word line wl(n) arranged in the RC region is completed, the voltage of the word line wl(n+1) arranged in the RC region is gradually decreased and then becomes being at a low level.

Moreover, after the activation of the word line wl(n) arranged in the RC region is started, the activation of the word line wl(n) arranged in the rC region is started. Further, herein, the voltage of the word line wl(n) arranged in the rC region is expressed as wl(n)[r]. During the period from the beginning of the activation of the word line wl(n) arranged in the rC region to the completion thereof, the voltage of the word line wl(n+1) arranged in the rC region is increased due to the occurrence of the crosstalk between the word line wl(n) and its adjacent word line (wl(n+1)) in the rC region. Herein, the voltage of the word line wl(n+1) arranged in the rC region is expressed as wl(n+1)[r]. Then, when the activation of the word line wl(n) arranged in the rC region is completed, the voltage of the word line wl(n+1) arranged in the rC region is gradually decreased.

As described above, when a memory cell MC in the rC region is accessed, the information raa[i] and the information raa[i−1] are set to the same value. Therefore, the delay time td_saon from the rising edge of the word-line activation signal wlon to the rising edge of the sense-amplifier activation signal saon becomes longer. Then, at time t12, when the sense-amplifier activation signal saon for activating the bit line bl(k) arranged in the rC region becomes being at a high level (valid), the sense amplifier 111 connected to the bit line bl(k) arranged in the rC region starts driving (activating) the above-mentioned bit line bl(k). Furthermore, the voltage of the bit line bl(k) arranged in the rC region is expressed as bl(k)[R].

Thereafter, at time t13, the voltage of the word line wl(n+1) arranged in the rC region becomes being at a low level. Then, at the subsequent time t14, the activation of the bit line bl(k) arranged in the rC region is completed.

In this way, when the position of the activated word line wl(n) is close to the sense amplifiers 111, regardless of whether the position of the word line wl(n) is close to the word line drivers 113, the timing of activating sense amplifiers 111 can be delayed. Therefore, even when the word line wl(n) close to the sense amplifier 111 is activated, the sense amplifier 111 can be activated after the voltage of the word line wl(n+1) adjacent to the above-mentioned word line wl(n) drops to a low level, thereby preventing the charges of the memory cell MC connected to the adjacent word line wl(n+1) from being decreased.

Figure 8B:
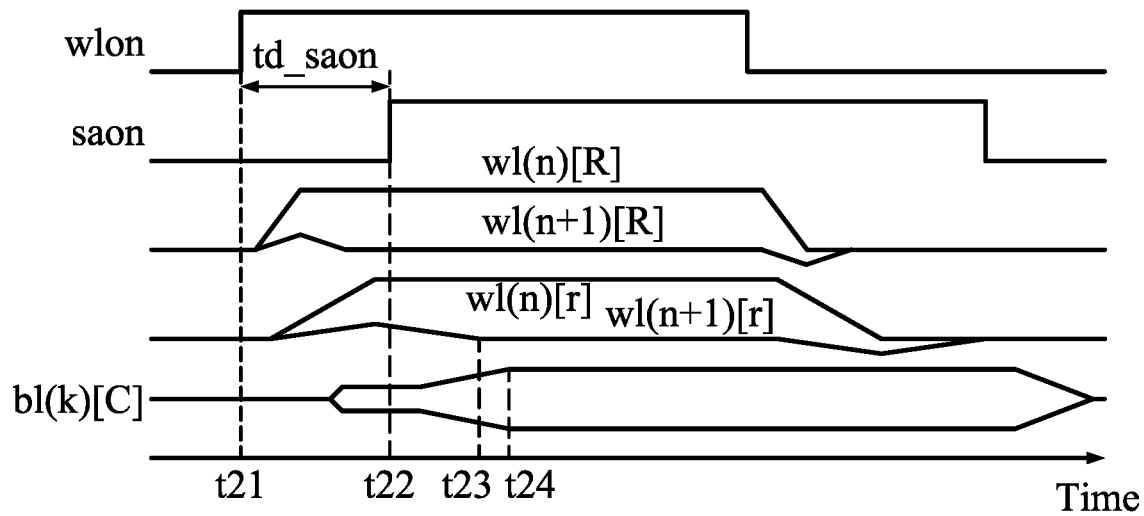

Next, referring to FIG. 8(b), the timing of activating the word lines wl(n) and wl(n+1) and the bit line bl(k) in the case where a memory cell MC in the region (rc region) far away from the word line drivers 113 and also far away the sense amplifiers 111 is accessed will be described. Furthermore, at time t21, when the word-line activation signal wlon becomes being at a high level (valid), changes in the voltages of the word line wl(n) and the word line wl(n+1) are the same as those shown in FIG. 8(a). Moreover, the voltage of the word line wl(n) arranged in the Rc region is expressed as wl(n)[R], and the voltage of the word line wl(n+1) arranged in the Rc region is expressed as wl(n+1) [R]. The voltage of the word line wl(n) arranged in the rc region is expressed as wl(n)[r], and the voltage of the word line wl(n+1) arranged in the rc region is expressed as wl(n+1)[r].

Herein, when a memory cell MC in the rc region is accessed, the information raa[i] and the information raa[i−1] are set to different values. Therefore, the delay time td_saon from the rising edge of the word-line activation signal wlon to the rising edge of the sense-amplifier activation signal saon becomes shorter. Then, at time t22, when the sense-amplifier activation signal saon for activating the bit line bl(k) arranged in the rc region becomes being at a high level (valid), the sense amplifier 111 connected to the bit line bl(k) arranged in the rC region starts driving (activating) the above-mentioned bit line bl(k). Furthermore, the voltage of the bit line bl(k) arranged in the rc region is expressed as bl(k)[c].

Furthermore, unlike the case shown in FIG. 8(a), since the rc region is far away from the sense amplifiers 111, it takes longer to complete the activation of the bit line bl(k) arranged in the rc region. Therefore, at time t23 when the activation of the bit line bl(k) arranged in the rc region is completed, the voltage of the word line wl(n+1) arranged in the rc region becomes being at a low level. Then, at the subsequent time t24, the activation of the bit line bl(k) arranged in the rc region is completed.

In this way, when the position of the activated word line wl(n) is far from the sense amplifiers 111, even if the set delay time td_saon becomes shorter, the sense amplifier 111 can be activated after the voltage of the word line wl(n+1) adjacent to the word line wl(n) drops to a low level. Therefore, the occurrence of interference can be suppressed.

As described above, when the position of the activated word line wl(n) is close to the sense amplifiers 111, the timing of activating sense amplifiers 111 is delayed. Therefore, for example, in the cases where the word line wl(n) close to the sense amplifiers 111 is activated, the sense amplifier 111 can be activated after the voltage of the word line wl(n+1) adjacent to the word line wl(n) drops to a low level. Therefore, the charges of the memory cell MC connected to the adjacent word line wl(n+1) can be prevented from being decreased. Accordingly, regardless of the position of the activated word line wl(n), the occurrence of interference can be suppressed.

Moreover, for example, in the cases where the bit lines which are connected to the sense amplifiers 111 of the sense amplifier array SAA at one end of the Y direction (the upper side in FIG. 4) and the bit lines which are connected to the sense amplifiers 111 of the sense amplifier array SAA at the other end of the Y direction (the lower side in FIG. 4) are alternately arranged in the X direction on the memory mat, the sense amplifiers of the sense amplifier column SAA at one end of the Y direction can be used to access certain memory cells MC which store one of the even-numbered data (such as DQ0, DQ2, etc.) and the odd-numbered data (such as DQ1, DQ3, etc.) on a specific data row. In addition, the sense amplifiers 111 of the sense amplifier row SAA at the other end of the Y direction can be used to access certain memory cells MC which store the other of the even data (such as DQ0, DQ2, etc.) and the odd-numbered data (such as DQ1, DQ3, etc.) on the data row. In this case, in order to access the respective data in the data row, the sense amplifiers 111 of the respective sense amplifier rows SAA at both ends of the Y direction are activated at the same time. Herein, even if the distance between the memory cells MC storing the respective data of the data row and the sense amplifier at one end of the Y direction is different from the distance between the memory cells MC storing the respective data of the data row and the sense amplifier at the other end of the Y direction (For example, the memory cells MC are close to the sense amplifier array SAA at one end of the Y direction, but far away from the sense amplifier array SAA at the other end of the Y direction), the timing of activating the sense amplifier 111 of the respective sense amplifier arrays SAA at the two ends of the Y direction can be controlled separately according to the position of the accessed memory cells MC.

Moreover, the above embodiments are described by taking the case where the ratio of the size of the RC and Rc regions in the X direction to the size of the rC and rc regions in the X direction is about 1:2 and the ratio of the size of the RC and rC regions in the Y direction to the size of the Rc and rc regions in the Y direction is about 1:2 as an example as shown in FIGS. 3-5, but the present invention is not limited thereto. For example, these ratios can be set arbitrarily.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor memory device comprising:
a plurality of word lines;
a bit line;
a plurality of memory cells connected to the bit line and one of the plurality of word lines;
a sense amplifier, connected to the bit line; and
a control portion configured to control timing of activating the sense amplifier according to a word-line activation signal for activating one of the plurality of the word lines, wherein when a position of an activated word line among the plurality of word lines is closer to the sense amplifier, the control portion controls a delay time from a time point when the word-line activation signal is valid to a time point when the sense amplifier is activated to be longer,
wherein the control portion comprises a first MOS capacitor and a second MOS capacitor,
wherein when the position of the activated word line among the plurality of word lines is closer to the sense amplifier, the control portion charges the first and second MOS capacitors to control the timing of activating the sense amplifier,
wherein when the position of the activated word line among the plurality of word lines is farther away from the sense amplifier, the control portion charges one of the first MOS capacitor and the second MOS capacitor to control the timing of activating the sense amplifier.

2. The semiconductor memory device as claimed in claim 1, wherein according to a signal representing the activated word line among the plurality of the word lines, the control portion controls the timing of activating the sense amplifier.

3. The semiconductor memory device as claimed in claim 1, wherein the control portion comprises:
a circuit portion configured to delay a signal for activating the sense amplifier when the word-line activation signal is input, such that when the position of the activated word line is closer to the sense amplifier, the delay time is longer.

4. The semiconductor memory device as claimed in claim 1, wherein when the plurality of word lines are classified into a plurality of groups according to the distance between the plurality of word lines and the sense amplifier, the control portion controls the timing of activating the sense amplifier based delay amount set for the group which the activated word line among the plurality of word lines is classified into, such that the set delay amount is greater as the distance between the group and the sense amplifier is shorter.

5. The semiconductor memory device as claimed in claim 4, wherein information is used to identify the group into which the activated word line among the plurality of word lines is classified and the information comprises a signal representing the activated word line among the plurality of word lines.

6. A semiconductor memory device comprising:
a plurality of word lines divided into a plurality of groups;
a first bit line;
a plurality of memory cells connected to the first bit line and one of the plurality of word lines;
a first sense amplifier connected to the first bit line; and
a control portion configured to receive a row address signal, receive a word-line activation signal for activating one of the plurality of the word lines, determine which group a to-be-activated word line belongs according to the row address signal, and control timing of activating the first sense amplifier according to the word-line activation signal,
wherein when a position of the group of the to-be-activated word line is closer to the first sense amplifier, the control portion controls a delay time from a time point when the word-line activation signal is valid to a time point when the first sense amplifier is activated to be longer,
wherein the control portion comprises a first MOS capacitor and a second MOS capacitor,
wherein when the position of the group of the to-be-activated word line is closer to the sense amplifier, the control portion charges the first and second MOS capacitors to control the timing of activating the sense amplifier,
wherein when the position of the group of the to-be-activated word line is farther away from the sense amplifier, the control portion charges one of the first MOS capacitor and the second MOS capacitor to control the timing of activating the sense amplifier.

7. The semiconductor memory device as claimed in claim 6, wherein the control portion comprises:
a circuit portion configured to delay a signal for activating the first sense amplifier when the row address signal and the word-line activation signal are input, such that when the position of the group of the to-be-activated word line is closer to the first sense amplifier, the delay time is longer.

8. The semiconductor memory device as claimed in claim 6, further comprising:
a second bit line; and
a second sense amplifier connect to the second bit line,
wherein when the position of the group of the to-be-activated word line is closer to the second sense amplifier, the control portion controls a delay time from the time point when the word-line activation signal is valid to a time point when the second sense amplifier is activated to be longer.

9. The semiconductor memory device as claimed in claim 8, wherein the plurality of memory cells are arranged as an array, the first sense amplifier is disposed on a first side of the array, and the second sense amplifier is disposed on a second side of the array opposite to the first side.

10. The semiconductor memory device as claimed in claim 8, wherein the plurality of word lines extend in a first direction, the first and second bit lines extend in a second direction, and the second direction is perpendicular to the first direction.

* * * * *